(12) United States Patent
Jordan et al.

(10) Patent No.: US 6,909,285 B2
(45) Date of Patent: Jun. 21, 2005

(54) METHOD FOR DETECTING FAILURE OF A RELAY

(75) Inventors: Paul Thomas Jordan, Lincoln Park, MI (US); John Harry Floros, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 10/241,101

(22) Filed: Sep. 11, 2002

(65) Prior Publication Data

US 2004/0047097 A1 Mar. 11, 2004

(51) Int. Cl.$^7$ ................................................ F02P 17/00
(52) U.S. Cl. ...................................... 324/382; 324/418
(58) Field of Search ............................... 324/418, 423, 324/380, 382, 503, 537; 318/139, 140; 180/404; 307/125, 9.1, 10.1

(56) References Cited

U.S. PATENT DOCUMENTS

| | | | |
|---|---|---|---|
| 4,864,287 A | 9/1989 | Kierstead | 340/648 |
| 5,206,572 A | 4/1993 | Farag et al. | 318/778 |
| 5,506,484 A | 4/1996 | Munro et al. | 318/599 |
| 5,528,120 A | 6/1996 | Brodetsky | 318/785 |
| 5,568,033 A | 10/1996 | Brunson | 318/778 |
| 5,748,427 A | 5/1998 | Yerkovich et al. | 361/92 |
| 5,811,884 A | 9/1998 | Matuoka et al. | 307/10.1 |
| 5,828,192 A | 10/1998 | Kawaguchi et al. | 318/139 |
| 5,877,601 A * | 3/1999 | Obara et al. | 318/139 |
| 5,886,429 A * | 3/1999 | Grady et al. | 307/125 |
| 6,002,221 A | 12/1999 | Ochiai et al. | 318/139 |
| 6,182,807 B1 | 2/2001 | Saito et al. | 191/2 |
| 6,439,336 B2 * | 8/2002 | Noro et al. | 180/404 |
| 2002/0057015 A1 | 5/2002 | Kikuta et al. | 307/10.1 |
| 2002/0070608 A1 | 6/2002 | Matsuki et al. | 307/9.1 |

FOREIGN PATENT DOCUMENTS

| | | |
|---|---|---|
| GB | 2333914 | 8/1999 |
| JP | 2000184764 A | 6/2000 |

OTHER PUBLICATIONS

Combined Search and Examination Report dated Dec. 15, 2003 for Gt. Britain Application No. 0319724.1, entitled Power Relay Proveout (3 pages).

\* cited by examiner

*Primary Examiner*—Vincent Q. Nguyen
(74) *Attorney, Agent, or Firm*—Dickinson Wright PLLC

(57) ABSTRACT

A method for detecting failure of a relay operating in a vehicle having an ignition switch, a power supply, a capacitor, and a pre-charge circuit to pre-charge the capacitor with the relay switching power from the power supply to the pre-charged capacitor, the method comprising the steps of: performing a capacitor pre-charge test; and performing a capacitor discharge test. Preferably, the capacitor pre-charge test is performed when the ignition is switched ON and the capacitor discharge test is performed when the ignition is switched OFF.

9 Claims, 2 Drawing Sheets

METHOD FOR DETECTING FAILURE OF A RELAY

BACKGROUND OF THE INVENTION

The present invention relates to a method for detecting failure of a relay and, in particular, to a method for detecting failure of a high current relay.

Some vehicle systems, such as Electric Power Assist Steering, traction control systems, blower systems, and the like, require a large amount of current from the vehicle battery. Often, these high current systems pulse width modulate (PWM) the power supplied to the system from the battery. As a result, the battery is typically buffered by way of an electronic control unit (ECU) from these high current loads. The ECU includes a high current relay and one or more bus capacitors. The relay switches or, in other words, connects and disconnects power from the battery to the bus capacitor. The bus capacitor buffers the power supplied by the battery as well as stores and filters high currents. To increase relay life as well as prevent a large inrush of current at vehicle system start-up that may damage the relay, the ECU further includes a pre-charge circuit electrically connected in series between the battery and the bus capacitor and electrically connected in parallel with the relay. At system start-up, the relay is open and the ECU activates the pre-charge circuit. After the bus capacitor is pre-charged, the ECU deactivates the pre-charge circuit and closes the relay connecting power from the battery to the pre-charged bus capacitor.

The high current relay can fail in several ways. For example, the relay can fail in an permanent closed condition, wherein the battery is connected to the bus capacitor, or a permanent open condition, wherein the battery is disconnected from the bus capacitor. Failure of the relay must be detected to ensure a proper operation from the ECU. Previous methods for detecting failure of the relay have several shortcomings. Some shortcomings of the previous failure detection methods include delaying the start-up of the high current system, requiring additional components to detect such relay failures, and failing to verify proper operation of the relay each ignition cycle. Accordingly, there is a desire to provide a method for detecting failure of a high current relay which overcomes the shortcomings of the prior art.

SUMMARY OF THE INVENTION

The present invention provides a method for detecting failure of a relay. In one embodiment of the present invention, the method includes the steps of: activating the pre-charge circuit to initiate pre-charging of the capacitor; closing the relay to provide power from the power supply to the capacitor; and checking the capacitor for a post-charged under-voltage condition.

In another embodiment of the present invention, the method includes the steps of: opening the relay to disconnect the power supply from the capacitor; and checking the capacitor for a discharged over-voltage condition.

In yet another embodiment of the present invention, the method includes the step of performing a capacitor discharge test. Preferably, the capacitor discharge test is performed after the vehicle ignition switch is OFF.

Further scope of applicability of the present invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The present invention will become more fully understood from the detailed description given here below, the appended claims, and the accompanying drawings in which:

DETAILED DESCRIPTION OF THE PREFERRED EMBODIMENT

Figure 1:
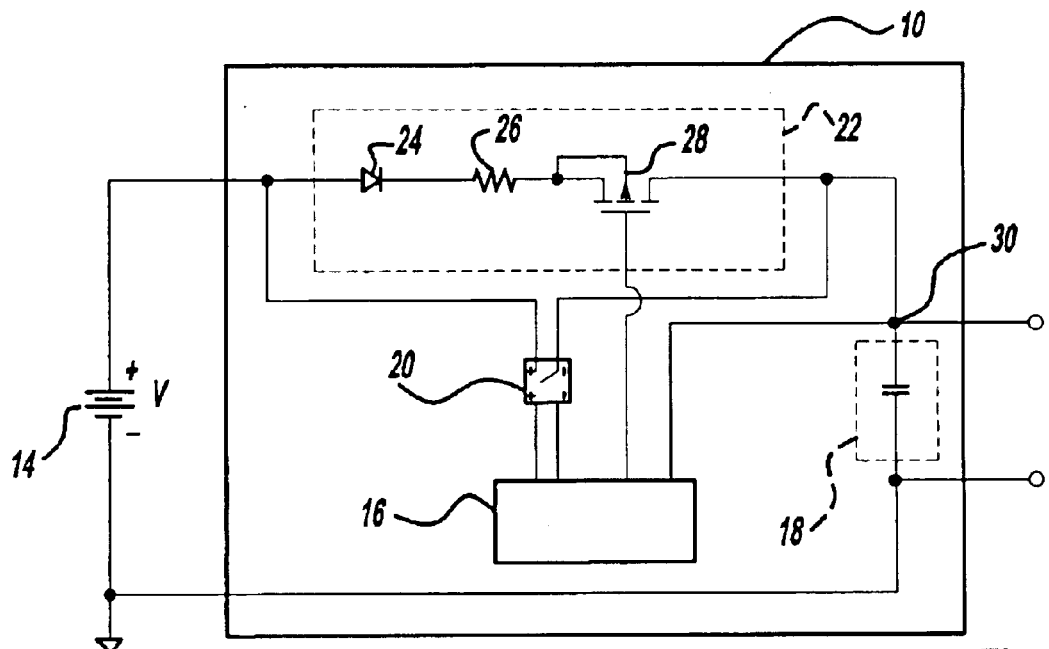
FIG. 1 is an electrical schematic of an electronic control unit (ECU)

FIG. 1 is an electrical schematic of an electronic control unit (ECU) 10. The ECU 10 illustrated in FIG. 1 is one example of an electronic module designed to provide buffered and controlled power to the load of a vehicle system, such as Electric Power Assist Steering, traction control system, blower system, and the like, requiring a large amount of current. The ECU 10, which receives power from a power supply 14, includes a microprocessor or microcontroller 16, one or more bus capacitors 18, and a high current relay 20. The bus capacitor 18 buffers the power supply 14 as well as stores and filters high currents. The relay 20 switches or, in other words, connects and disconnects power from the power supply 14 to the bus capacitor 18 and load. To increase relay life as well as prevent a large inrush of current at start-up that may damage the relay 20, the ECU 10 further includes a pre-charge circuit 22 electrically connected in series between the power supply 14 and the bus capacitor 18 and electrically connected in parallel with the relay 20. The pre-charge circuit 22 includes a diode 24, a resistor 26, and a transistor 28 (illustrated as a p-channel enhancement-type MOSFET). The transistor 28 may be used as a switch or to limit the flow of current supplied to the capacitor 18 during pre-charge. At start-up, the relay 20 is open and the microprocessor 16 produces a control signal to activate the pre-charge circuit 22 by switching the pre-charge transistor 28 to a conducting or ON condition. At this time, the bus capacitor 18 is pre-charged with power through the pre-charge circuit 22. After the elapse of a predetermined pre-charging time period, the microprocessor 16 produces one control signal to deactivate the pre-charge circuit 22 by switching the pre-charge transistor 28 to a non-conducting or OFF condition and produces another control signal to close the relay 20. At this time, the pre-charged bus capacitor 18 receives power from the battery 14 through the relay 20. The ECU 10 also includes a timer, non-volatile memory for storing or logging detected relay failures, a self-power or keep-alive mode for continued, but limited, operation of microprocessor functions after the ignition is switched OFF, and a tap at node 30 through which the microprocessor 16 can measure the voltage across the bus capacitor 18 or, in other words, the voltage supplied to the load.

Figure 3:
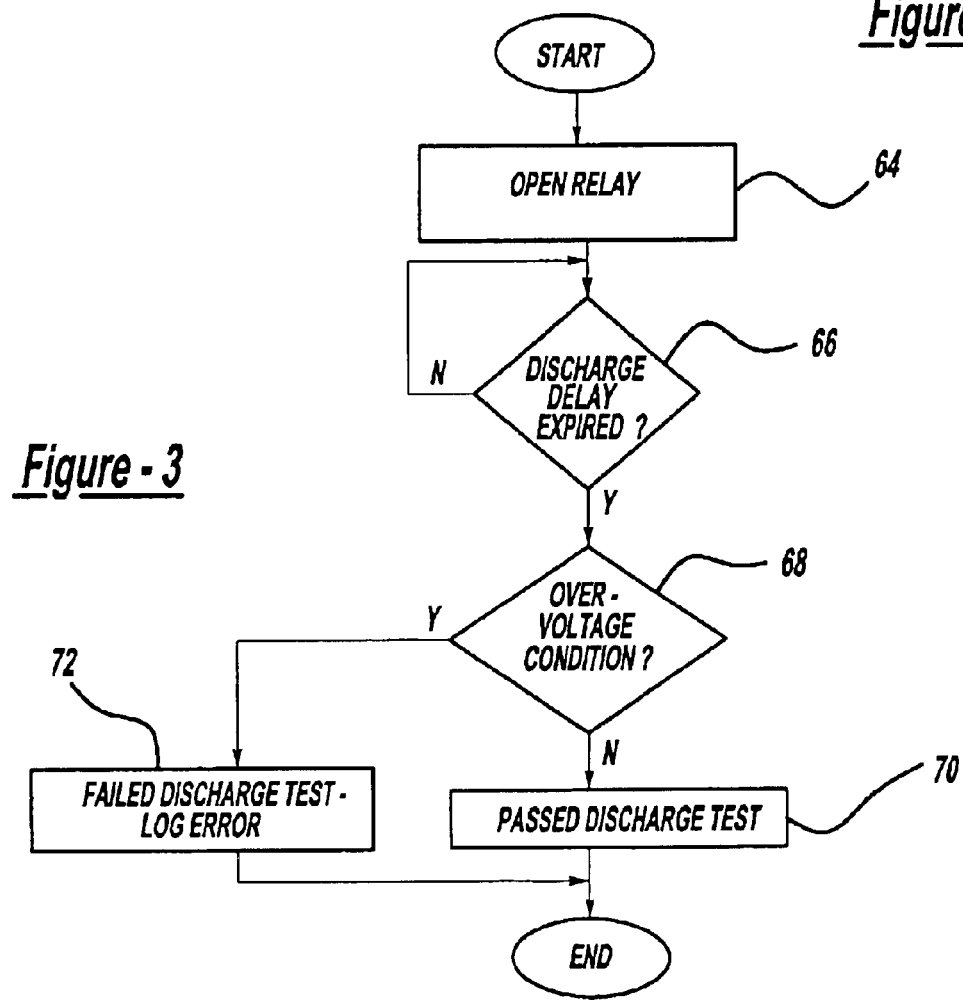
FIGS. 2 and 3 are flow charts illustrating a method for detecting a failure of a relay in accordance with the present invention.
Figure 2:
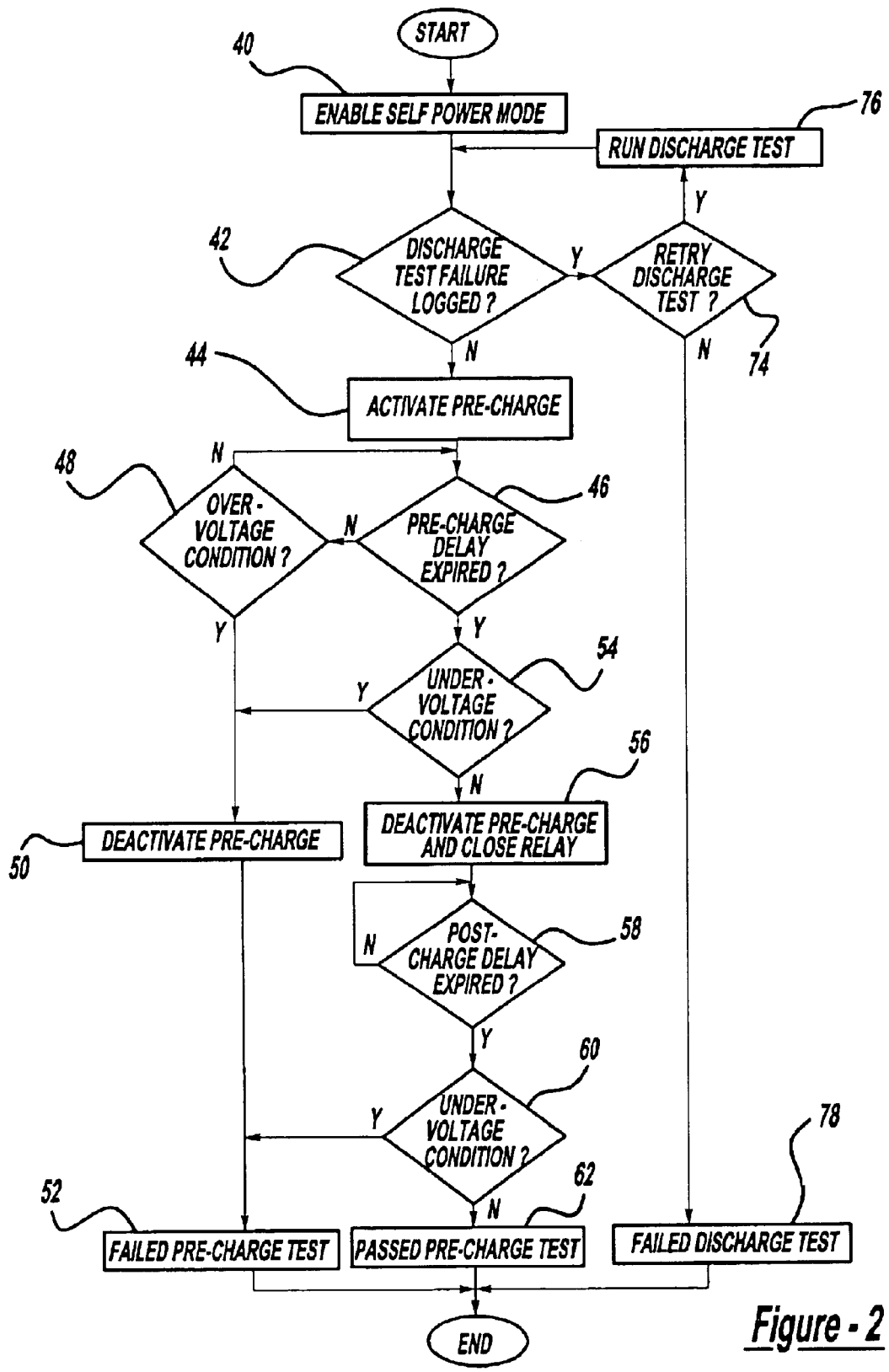

Referring now to FIGS. 2 and 3, flow charts illustrating a method for detecting failure of a relay according the present invention are shown. As will be appreciated by one of ordinary skill in the art, the method illustrated may be performed in software, hardware, or a combination of both as in a preferred embodiment of the present invention.

Referring now to FIG. 2, a flow chart illustrating a portion of a method for detecting a failure of a relay and, more particularly, illustrating a method for performing a capacitor pre-charge test is shown. In a preferred embodiment of the present invention, the steps illustrated in FIG. 2 are performed when the vehicle ignition switch is turned from OFF to ON. Initially, a self-power or keep-alive mode within the ECU is enabled when the vehicle ignition switch is turned ON as represented by block 40. Thus, should the vehicle operator quickly turn the ignition switch back to OFF before completion of the steps below, the self-power mode will provide sufficient power to a properly power down the microprocessor. Next, the microprocessor checks the non-volatile memory for a capacitor discharge test failure which may have been logged or stored after the last ignition cycle as represented by block 42. This step is described in greater detail below. The relay is open and the microprocessor activates the pre-charge circuit as represented by block 44.

The relay remains open and the pre-charge circuit remains active for a predetermined pre-charging time period. Because the pre-charge circuit is optimized for the charging operation, this predetermined pre-charging time period is relatively short (on the order of 500 milliseconds) and may be measured by the timer in the ECU. As represented by block 46, the ECU queries whether the predetermined pre-charging time period has expired.

If the predetermined pre-charging time period has not elapsed, then the ECU checks the capacitor, via the voltage tap, for a pre-charge over-voltage condition or, in other words, the ECU checks whether the capacitor voltage is greater than a maximum pre-charge voltage level as represented by block 48. In one embodiment of the present invention, the maximum pre-charge voltage level is set slightly greater than the nominal range of the power supply. If a pre-charge over-voltage condition is detected, the ECU deactivates the pre-charge circuit as represented by block 50 and the capacitor pre-charge test has failed as represented by block 52. In one embodiment of the present invention, the capacitor pre-charge test may be re-performed. If a pre-charge over-voltage condition is not detected, the method returns to block 46.

If the predetermined pre-charging time period has elapsed, then the ECU checks the capacitor for a pre-charge under-voltage condition or, in other words, the ECU checks whether the capacitor voltage is less than a minimum pre-charge voltage level as represented by block 54. In one embodiment of the present invention, the minimum pre-charge voltage level is set slightly less than the nominal range of the power supply. If a pre-charge under-voltage condition is detected, the ECU deactivates the pre-charge circuit as represented by block 50 and the capacitor pre-charge test has failed as represented by block 52. In one embodiment of the present invention, the capacitor pre-charge test may be re-performed. If a pre-charge under-voltage condition is not detected, then the ECU deactivates the pre-charge circuit and closes the relay as represented by block 56.

The relay remains closed for a predetermined post-charged time period. This predetermined post-charged time period (on the order of 10 milliseconds) may be measured by the timer in the ECU. As represented by block 58, the ECU queries whether the predetermined post-charged time period has expired. After the post-charged time period has elapsed, the ECU checks the capacitor for a post-charged under-voltage condition or, in other words, the ECU checks whether the capacitor voltage is less than a minimum post-charged voltage level as represented by block 60. In one embodiment of the present invention, the minimum post-charged voltage level is set slightly less than nominal range of the power supply. If a post-charged under-voltage condition is detected, the capacitor pre-charge test has failed as represented by block 52. In one embodiment of the present invention, the capacitor pre-charge test may be re-performed. If a post-charged under-voltage condition is not detected, then the capacitor pre-charge test has passed, as represented by block 62, and it is known that the relay contacts are closed and have not failed in a "stuck open" mode.

Referring now to FIG. 3, a flow chart illustrating a portion of a method for detecting a failure of a relay and, more particularly, illustrating a method for performing a capacitor discharge test is shown. In a preferred embodiment of the present invention, the steps illustrated in FIG. 3 are performed when the vehicle ignition switch is turned from ON to OFF. In this sequence, the time required to perform the capacitor discharge test does not delay the start-up of the vehicle system. Initially, the ECU opens the relay as represented by block 64. The relay remains opens and the capacitor discharges energy for a predetermined discharge time period. This predetermined discharge time period is relatively long (on the order of 60 seconds) may be measured by the timer in the ECU. As represented by block 66, the ECU queries whether the predetermined discharge time period has expired. After the discharge time period has elapsed, the ECU checks the capacitor for a discharged over-voltage condition or, in other words, the ECU checks whether the capacitor voltage is greater than a maximum discharge voltage level as represented by block 68. If a discharged over-voltage condition is not detected, then the capacitor discharge test has passed, as represented by block 70, and it is known that the relay contacts are open and have not failed in a "stuck closed" mode.

If a discharged over-voltage condition is detected, the capacitor discharge test has failed and such failure is logged or stored in the non-volatile memory of the ECU as represented by block 72. Now referring back to block 42 of FIG. 2, during the next ignition cycle or, in other words, when the vehicle operator turns the ignition switch from OFF to ON, the ECU will check and find a discharge test failure stored in the non-volatile memory. Next, the ECU determines whether the capacitor discharge test should be re-performed as represented by block 74. If the capacitor discharge test should be re-performed, steps 64–72 are re-executed as represented by block 76. If the capacitor discharge test should not be re-performed, the discharge test has failed as represented by block 78.

Due to large capacitance, the energy stored in the bus capacitors 18 discharges or bleeds off slowly through adjacent circuitry resulting in a relatively slow decay of the capacitor voltage. The capacitor discharge test could be performed when the ignition switch is turned from OFF to ON, however the amount of time required to perform the test would significantly delay the ECU's start-up routine. Additional active bleed-off circuitry would reduce the decay time, however this circuitry increases cost and complexity as well as adds failure modes. Accordingly, the present invention performs the capacitor discharge test after the ignition has been turned OFF when the delay is no longer noticeable. At ignition OFF, the ECU normally shuts down operation, opens the relay, and prepares for power off. At this time, the bus capacitor voltage slowly decays by naturally bleeding off energy through adjacent circuitry. Using the keep-alive mode, the processing circuitry of the ECU remains active to monitor the decay of the bus capacitor voltage. If the bus capacitor voltage does not decay to the expected level within the expected time, then the ECU records a failure to the non-volatile memory before powering off. At the next ignition ON, the ECU only needs to check the non-volatile memory for a failure code instead of performing the entire capacitor discharge test.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A method for detecting failure of a relay operating in a vehicle having an ignition switch, a power supply, a capacitor, and a pre-charge circuit to pre-charge the capacitor with the relay switching power from the power supply to the pre-charged capacitor, the method comprising the step of:
   performing a capacitor discharge test, wherein the step of performing a capacitor discharge test includes the steps of:
   opening the relay to disconnect the power supply from the capacitor;
   checking the capacitor for a discharged over-voltage condition; and
   delaying opening the relay to disconnect the power supply from the capacitor for a predetermined discharge time period and wherein the step of checking the capacitor for a discharged over-voltage condition is performed after the predetermined discharge time period has elapsed.

2. The method of claim 1 further including the step of storing a capacitor discharge failure error in memory when a discharged over-voltage condition is detected.

3. A method for detecting failure of a relay operating in a vehicle having an ignition switch, a power supply, a capacitor, and a pre-charge circuit to pre-charge the capacitor with the relay switching power from the power supply to the pre-charged capacitor, the method comprising the steps of:
   performing a capacitor discharge test, and
   performing a capacitor pre-charge test, wherein the step of performing a capacitor pre-charge test includes the steps of:
      activating the pre-charge circuit to initiate pre-charging of the capacitor;
      checking the capacitor for a pre-charge over-voltage condition;
      checking the capacitor for a pre-charge under-voltage condition;
      deactivating the pre-charge circuit;
      closing the relay to provide power from the power supply to the capacitor; and
      checking the capacitor for a post-charged under-voltage condition.

4. The method of claim 3 wherein the capacitor pre-charge test is performed after the ignition switch is ON.

5. The method of claim 3 further including a step of delaying for a predetermined post-charged time period before checking the capacitor for a post-charged under-voltage condition is performed.

6. The method of claim 5 wherein the step of checking the capacitor for a pre-charge under-voltage condition is performed after the predetermined pre-charging time period has elapsed.

7. The method of claim 3 wherein the step of checking the capacitor for a pre-charge over-voltage condition further includes repetitively checking the capacitor for a pre-charge over-voltage condition for a predetermined pre-charging time period.

8. A method for detecting failure of a relay operating in a vehicle having an ignition switch, a power supply, a capacitor, and a pre-charge circuit to pre-charge the capacitor with the relay switching power from the power supply to the pre-charged capacitor, the method comprising the steps of:
   performing a capacitor discharge test;
   activating the pre-charge circuit to initiate pre-charging of the capacitor;
   deactivating the pre-charge circuit;
   closing the relay to provide power from the power supply to the capacitor;
   checking the capacitor for a post-charged under-voltage condition;
   checking the capacitor for a pre-charge over-voltage condition; and
   checking the capacitor for a pre-charge under-voltage condition,
wherein the step of checking the capacitor for a pre-charge over-voltage condition further includes repetitively checking the capacitor for a pre-charge over-voltage condition for a predetermined pre-charging time period.

9. The method according to claim 8 wherein the step of checking the capacitor for a pre-charge under-voltage condition is performed after the predetermined pre-charging time period has elapsed.

* * * * *